(12) United States Patent
Klein et al.

(10) Patent No.: US 6,750,483 B2
(45) Date of Patent: Jun. 15, 2004

(54) SILICON-GERMANIUM BIPOLAR TRANSISTOR WITH OPTIMIZED GERMANIUM PROFILE

(75) Inventors: Wolfgang Klein, Zorneding (DE); Rudolf Lachner, Ingolstadt (DE); Wolfgang Molzer, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,541

(22) Filed: Jul. 22, 2002

(65) Prior Publication Data

US 2003/0006486 A1 Jan. 9, 2003

Related U.S. Application Data

(63) Continuation of application No. PCT/DE01/00033, filed on Jan. 8, 2001.

(30) Foreign Application Priority Data

Jan. 20, 2000 (DE) .......................... 100 02 364

(51) Int. Cl.[7] ............................................. H01L 29/737
(52) U.S. Cl. ..................................... 257/198; 257/191
(58) Field of Search ................................ 257/191, 198

(56) References Cited

U.S. PATENT DOCUMENTS

| 5,302,841 A | 4/1994 | Yamazaki |
| 5,323,031 A | 6/1994 | Shoji et al. |
| 5,352,912 A | 10/1994 | Crabbe et al. |
| 6,388,307 B1 * | 5/2002 | Kondo et al. ............... 257/592 |

FOREIGN PATENT DOCUMENTS

| DE | 197 55 979 A1 | 6/1999 |
| EP | 0 541 971 A2 | 5/1993 |
| EP | 0 552 561 A2 | 7/1993 |
| EP | 0 818 829 A1 | 1/1998 |

OTHER PUBLICATIONS

Das, K. et al.: "Copper–Based OHMIC Contacts for the SiGe/Si Heterojunction Bipolar Transistor (HBT) Structure", Materials Research Society, vol. 564, 1999, pp. 195–200.
Crabbé, E. F. et al.: "Current Gain Rolloff in Graded–Base SiGe Heterojunction Bipolar Transistors", IEEE, vol. 14, No. 4, Apr. 1993, pp. 193–195.
Robbins, D. J. et al.: "Characterisation of Heterojunction Bipolar Transistors Incorporating $Si/Si_{1-x}Ge_x$ Epitaxial Double Layers With $n^+$ Emitter Implants", Elsevier Science Publishers B.V., 1992, pp. 447–450.
Nguyen–Ngoc, D. et al.: "Ion–Implanted Base SiGe PNP Self–Aligned SEEW Transistors", IEEE, 1991, pp. 75–78.
Harame, D. L. et al.: "30 GHz Polysilicon–Emitter and Single–Crystal Emitter Graded SiGe–Base PNP Transistors", IEEE, 1990, pp. 2.7.1–2.7.4.
Harame, D. L. et al.: "Optimization of SiGe HBT Technology for High Speed Analog and Mixed–Signal Applications", IEEE, 1993, pp. 4.3.1.–4.3.4.

\* cited by examiner

*Primary Examiner*—Jerome Jackson
(74) *Attorney, Agent, or Firm*—Laurence A. Greenberg; Werner H. Stemer; Gregory L. Mayback

(57) ABSTRACT

A silicon-germanium bipolar transistor includes a silicon substrate in which a first n-doped emitter region, a second p-doped base region adjoining the latter and a third n-doped collector region adjoining the latter, are formed. A first space charge zone is formed between the emitter region and the base region and a second space charge zone is formed between the base region and the collector region. The base region and an edge zone of the adjoining emitter region are alloyed with germanium. The germanium concentration in the emitter region rises toward the base region. The germanium concentration in a junction region containing the first space charge zone rises less sharply than in the emitter region or decreases and, in the base region, it initially again rises more sharply than in the junction region.

6 Claims, 2 Drawing Sheets

SILICON-GERMANIUM BIPOLAR TRANSISTOR WITH OPTIMIZED GERMANIUM PROFILE

CROSS-REFERENCE TO RELATED APPLICATION

This application is a continuation of copending International Application No. PCT/DE01/00033, filed Jan. 8, 2001, which designated the United States and was not published in English.

BACKGROUND OF THE INVENTION

Field of the Invention:

The invention relates to a silicon-germanium bipolar transistor having a germanium concentration profile which is optimized for the purpose of reducing an operating-point-dependent variation of the current gain.

Silicon-germanium bipolar transistors, which are abbreviated as SiGeBTs, represent a further development of silicon bipolar transistors and are distinguished by special performance in the high-frequency range.

In the case of such SiGeBTs, a base region and an edge zone of an adjoining emitter region are alloyed with germanium (Ge) in a targeted manner. Through the use of a suitable Ge concentration profile, in that region of the transistor, the band gap between valence and conduction bands is smaller, with the effect that charge carriers traverse the base region more rapidly. Therefore, SiGeBTs have very high limiting frequencies and are particularly suitable for high-frequency applications. Such SiGeBTs are known, for example, from an article in IEEE Electron Device Letters, Vol. 4, 1993 by F. Crabbe et al..

In an SiGeBT, the base region is usually alloyed with from 10 to 25% by weight of Ge. The transition in the Ge concentration from the emitter to the base has a profile that rises either abruptly or approximately linearly. With regard to the high-frequency properties of SiGeBTs, a Ge concentration profile with an approximately linear rise has proved to be optimal.

That concentration profile has the disadvantage of causing the current gain to be greatly dependent on the collector current which is respectively flowing. That disadvantage can be attributed to the fact that the current gain of a transistor is related to the position of the space charge zone of the emitter/base pn junction, which is abbreviated as EB space charge zone. In that case, the following two factors are significant:

Firstly, the current gain of a transistor falls with a rising base charge, which is determined by the position of the space charge zone.

Secondly, the current gain is a negative exponential function of the band gap in the base, in particular at the base-side boundary of the EB space charge zone.

With a rising base-emitter voltage, the base-side boundary of the EB space charge zone migrates in the direction of the emitter so that, on one hand, the base charge rises and, on the other hand, at that boundary the band gap is enlarged due to the falling Ge concentration. Both effects lead to a major reduction in the current gain.

Since the collector current also rises with a rising base-emitter voltage, the current gain indirectly depends on the collector current or on the operating point of the transistor and falls sharply with a rising collector current. That dependence is undesirable since, as a result, the linearity of the transistor is impaired and the dynamic range of the transistor is limited.

SUMMARY OF THE INVENTION

It is accordingly an object of the invention to provide a silicon-germanium bipolar transistor with an optimized germanium profile, which overcomes the hereinafore-mentioned disadvantages of the heretofore-known devices of this general type and which reduces an operating-point-dependent variation of a current gain of an SiGeBT.

With the foregoing and other objects in view there is provided, in accordance with the invention, a silicon-germanium bipolar transistor, comprising a silicon substrate and, formed in the silicon substrate: a first n-doped emitter region having an edge zone, a second p-doped base region adjoining the emitter region and a third n-doped collector region adjoining the base region. A first space charge zone is formed between the emitter region and the base region and a second space charge zone is formed between the base region and the collector region. The base region and the edge zone of the adjoining emitter region are alloyed with germanium. The emitter region has a germanium concentration rising toward the base region. A junction region contains the first space charge zone and has a germanium concentration rising less sharply than in the emitter region or decreasing. The base region has a germanium concentration initially rising more sharply than in the junction region.

In the case of the transistor according to the invention, in a narrow region in the vicinity of the EB space charge zone, the Ge concentration profile deviates from the customary Ge profiles with an approximately linear rise in the Ge concentration. According to the invention, the Ge alloy is embodied in such a way that, in the event of a shift in the base-side boundary of the EB space charge zone, the factors which cause the change in the current gain largely compensate for one another.

The variation of the current gain becomes smaller, the smaller the rise in the Ge concentration in the direction of the collector and the further this rise is shifted in the direction of the collector. In the case of the Ge doping profiles according to the invention, the Ge concentration rises less sharply or falls toward the base in the vicinity of the EB space charge zone as compared with the adjoining regions.

In accordance with another feature of the invention, the Ge concentration is kept constant at a suitable level in the vicinity of the EB space charge zone.

In accordance with a further feature of the invention, the Ge profile is configured in such a way that the Ge concentration decreases in the vicinity of the EB space charge zone. In this case, the concentration gradient is chosen in such a way that the operating-point-dependent variation of the current gain is optimally compensated for.

In accordance with a concomitant feature of the invention, the emitter region and the collector region are p-doped and the base region is n-doped.

It is advantageous that, in the case of this invention, there is a reduction in the production-dictated manufacturing tolerance for SiGeBTs with regard to the nominal current gain.

This normally very large fluctuation in the nominal current gain of SiGeBTs is based on the fact that, due to unavoidable production tolerances, the exact position of the emitter-base pn junction relative to the Ge profile varies from transistor to transistor. In the case of the germanium profile configuration according to the invention, this production-dictated variation leads to smaller changes in the nominal current gain than in the case of SiGeBTs according to the prior art.

A further advantage of this invention is that the nominal current gain can be set very precisely due to the targeted alteration of the Ge concentration in the region of the emitter-base pn junction or the adaptation of the Ge concentration in this region to the maximum Ge content.

Since only a small region in the linear rise of the Ge profile is modified, the high-frequency properties of an SiGeBT are only marginally altered by the Ge profile configuration according to the invention.

Other features which are considered as characteristic for the invention are set forth in the appended claims.

Although the invention is illustrated and described herein as embodied in a silicon-germanium bipolar transistor with an optimized germanium profile, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
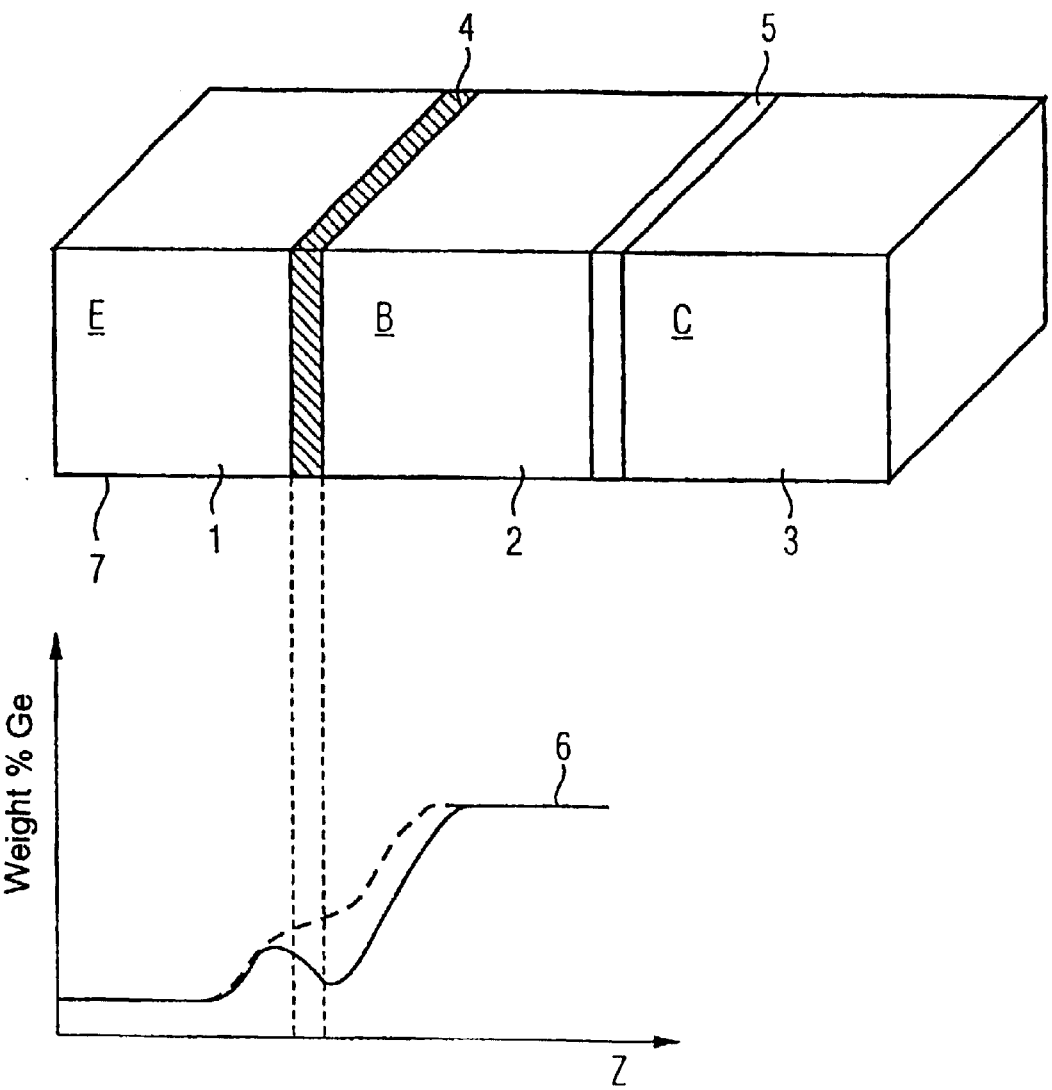
FIG. 1 is a diagrammatic, perspective view of the construction of an SiGeBT with an optimized Ge profile.

Referring now to the figures of the drawings in detail and first, particularly, to FIG. 1 thereof, there is seen a perspective illustration of a semiconductor body of an SiGeBT and a Ge profile according to the invention which is plotted in the plane of the drawing.

An n-doped emitter region 1, which is adjoined by a p-doped base region 2, followed in turn by an n-doped collector region 3, are formed in a silicon substrate 7. Naturally, the n and p-doped regions could have the opposite conduction types. An EB space charge zone 4 is situated between the emitter region 1 and the base region 2. A base-collector space charge zone 5 is situated between the base region 2 and the collector region 3.

The transistor is alloyed with Ge in the base region 2 and in an adjoining edge region of the emitter 1. A Ge concentration profile 6 is graphically illustrated along the transistor for two embodiments according to the invention.

In the emitter region, the Ge concentration 6 initially rises toward the base. According to the invention, the concentration profile 6 deviates from a linear dependence in a junction region between the base and the emitter in which the EB space charge zone 4 is located. In this junction region, the Ge concentration preferably decreases in the direction of the base 2.

Figure 2:
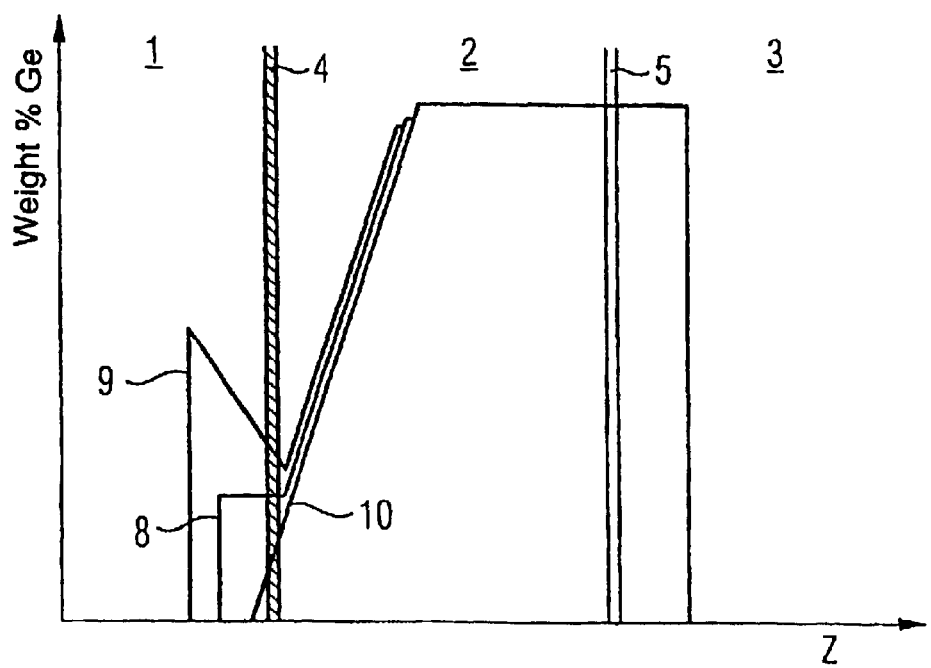
FIG. 2 is a graph showing two Ge profiles according to the invention in comparison with a Ge profile according to the prior art.

FIG. 2 shows three Ge profiles for which the current gain was calculated as a function of the collector current. A profile 10 shows the prior art with linear progression of the Ge profile between the emitter 1 and the base 2. In the case of a profile 8 according to the invention, the Ge concentration progression has a plateau in the vicinity of the EB space charge zone 4. The Ge concentration is constant in this region. A profile 9 according to the invention represents a so-called "negative graded profile", in which the Ge concentration decreases toward the base in the vicinity of the EB space charge zone 4. In this case, the plateau height in the profile 8 or the concentration minimum in the emitter-base region in the profile 9 is adapted to the further Ge concentration progression in the base 2 and the maximum Ge content in the collector 3.

Figure 3:
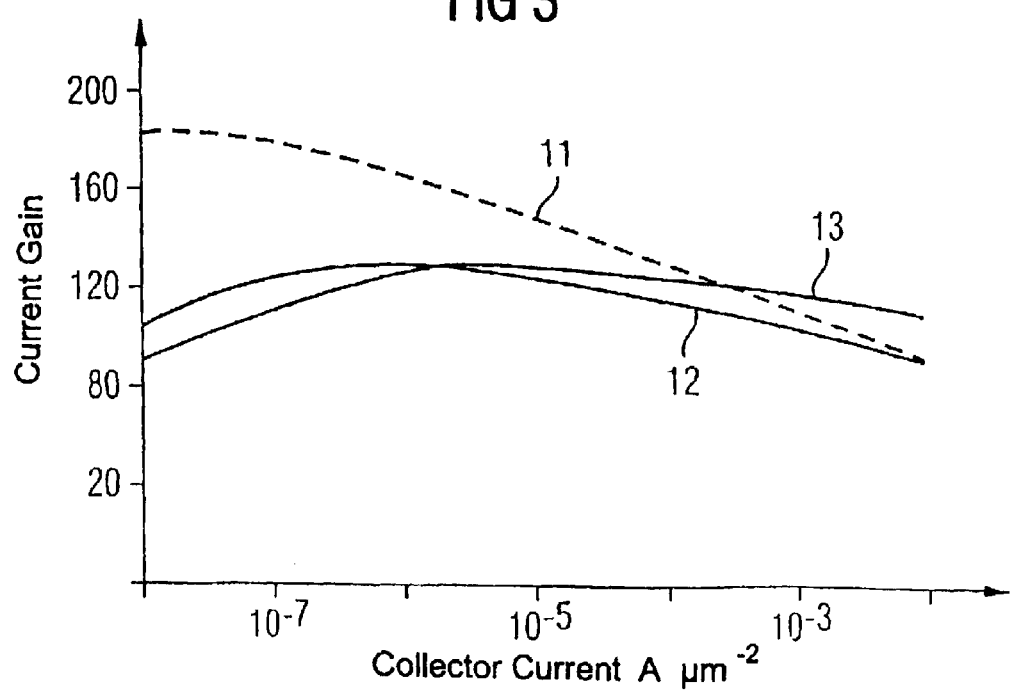
FIG. 3 is a graph showing a calculated current gain as a function of a collector current density for the Ge profiles illustrated in FIG. 2.

FIG. 3 illustrates a current gain obtained from simulation calculations as a function of the collector current for the Ge profiles shown in FIG. 2.

A current gain curve 11, which is associated with the Ge profile 10 and describes the prior art, varies in the interval illustrated by more than 50%, relative to a maximum value of the current gain. By contrast, a current gain curve 12 of the Ge profile 8 according to the invention, or a curve 13 for the profile 9, generally has a very much smaller range of variation. In this case, the current gain varies in the region illustrated by less than 30%, relative to the maximum value of the current gain.

The Ge profiles 8 and 9 according to the invention differ in their effect primarily in the fall in the current gain as a function of the collector current density beyond the maximum current gain. The profile 9 proves to be particularly advantageous in this case since the associated current gain curve 13 has the smallest gradient, that is to say is influenced the least by a variable collector current.

As already explained, the advantageous smaller variation of the current gain is based on the profile of the band gap in the vicinity of the EB space charge zone. In the case of the transistors according to the invention, this profile is achieved through the use of a suitable Ge concentration profile.

The smaller variation of the current gain can also be realized by other measures which modify the band gap in the same way. Examples include other dopings or strains of the semiconductor substrate.

We claim:

1. A silicon-germanium bipolar transistor, comprising:

a silicon substrate;

a first emitter region formed in said silicon substrate and having a first conduction type and an edge zone;

a second base region formed in said silicon substrate, adjoining said emitter region and having a second conduction type opposite said first conduction type;

a third collector region formed in said silicon substrate, adjoining said base region and having said first conduction type;

a first space charge zone formed between said emitter region and said base region;

a second space charge zone formed between said base region and said collector region;

said base region and said edge zone of said adjoining emitter region being alloyed with germanium;

said emitter region having a germanium concentration rising toward said base region;

a junction region containing said first space charge zone and having a decreasing germanium concentration in the junction region and in a vicinity of the junction region, a profile of the germanium concentration decreasing such that the first space charge zone is located in a region with a negative graded germanium concentration profile; and said base region having a germanium concentration initially rising more sharply than in said junction region.

2. A silicon-germanium bipolar transistor, comprising;

a silicon substrate;

a first emitter region formed in said silicon substrate and having a first conduction type and an edge zone;

a second base region formed in said silicon substrate, adjoining said emitter region and having a second conduction type opposite said first conduction type;

a third collector region formed in said silicon substrate, adjoining said base region and having said first conduction type;

a first space charge zone formed between said emitter region and said base region;

a second space charge zone formed between said base region and said collector region;

said base region and said edge gone of said adjoining emitter region being alloyed with germanium;

said emitter region having a germanium concentration rising toward said base region, a junction region containing said first space charge zone and having a linearly falling germanium concentration in the junction region and in a vicinity of the junction region, a profile of the germanium concentration decreasing such that the first space charge zone is located in a region with a negative graded germanium concentration profile; and said base region having a germanium concentration initially rising more sharply than in said junction region.

3. The silicon-germanium bipolar transistor according to claim 1, wherein said emitter region and said collector region are p-doped and said base region is n-doped.

4. The silicon-germanium bipolar transistor according to claim 2, wherein said emitter region and said collector region are p-doped and said base region is n-doped.

5. The silicon-germanium bipolar transistor according to claim 1, wherein said emitter region and said collector region are n-doped and said base region is p-doped.

6. The silicon-germanium bipolar transistor according to claim 2, wherein said emitter region and said collector region are n-doped and said base region is p-doped.

* * * * *